United States Patent [19]

Glass

[11] 4,200,484
[45] Apr. 29, 1980

[54] METHOD OF FABRICATING MULTIPLE LAYER COMPOSITE

[75] Inventor: Howard L. Glass, Orange, Calif.

[73] Assignee: Rockwell International Corporation, El Segundo, Calif.

[21] Appl. No.: 831,033

[22] Filed: Sep. 6, 1977

[51] Int. Cl.² ............................................. B01J 17/04
[52] U.S. Cl. .................................. 156/622; 333/148; 156/624; 427/128
[58] Field of Search ....................... 156/621, 622, 624; 427/85, 86, 89, 92, 431, 128; 29/576 E, 578; 148/171, 6.14 R, 6.11; 333/30 M

[56] References Cited

U.S. PATENT DOCUMENTS

| 3,859,148 | 1/1975 | Dawson et al. ....................... 148/171 |
| 3,864,647 | 2/1975 | Bongianni ......................... 333/30 M |

OTHER PUBLICATIONS

Journal of Applied Physics, v. 45, No. 10, Oct. 74, Ganguly et al., pp. 4665–4667.
IEEE Transactions on Microwave Theory and Techniques, vol. MTT-24, No. 9, Sep. 76, pp. 591–597 Tsutsumi.
Mat. Res. Bull., v. 12, pp. 735–740, 7/77, Glass et al.

Primary Examiner—Hiram H. Bernstein
Attorney, Agent, or Firm—H. Fredrick Hamann; Gilbert H. Friedman

[57] ABSTRACT

A pair of substrates is mounted with first faces thereof directed away from each other and second faces thereof in sealing contact with each other. The substrates are then immersed in a first molten flux for depositing a film of a first material on the first faces of each of the substrates by liquid phase epitaxy (LPE). During the immersion in the first molten flux, the second faces of the substrates, being clamped against each other, seal each other from contact with the flux. After removal from the first flux, the pair of substrates is mounted with the films on the first faces thereof in sealing contact with each other. The substrates are then immersed in a second molten flux for depositing a film of a second material on the second faces of each of the substrates by LPE. The second material is, typically, different from the first material. During the immersion in the second molten flux, the films on the first faces of the substrates, being clamped against each other, seal each other from contact with the flux.

8 Claims, 7 Drawing Figures

METHOD OF FABRICATING MULTIPLE LAYER COMPOSITE

The invention herein described was made in the course of or under a contract or subcontract thereunder with the Air Force.

BACKGROUND OF THE INVENTION

1. Field of the Invention

The present invention relates to a method for depositing a second film on a second face of a substrate by the dipping method of liquid phase epitaxy (LPE) and more particularly pertains to the fabrication of a multiple layer composite wherein two films of materials which are different from each other are deposited on opposite faces of a substrate by the dipping method of LPE.

2. Description of the Prior Art

The epitaxial deposition of films of different materials on the opposite faces of a wafer substrate can be accomplished by any method of epitaxial deposition which affects only one face of the wafer at a time. During chemical vapor deposition (CVD), for example, the wafer rests on a plate with only one face exposed. A film is epitaxially deposited on the exposed face while the opposite face is protected from deposition by the plate. However, CVD epitaxy techniques are not the ones of choice for some applications. It has not been demonstrated that CVD techniques can be controlled to grow complex compositions having precisely determined amounts of substituents or dopants incorporated therein. Such control is important in applications such as, for example, magnetostatic surface wave propagation on ferrimagnetic, or ferrite, films epitaxially deposited on nonmagnetic substrates. Materials are termed "ferrimagnetic" herein in accordance with the definition of ferrimagnetism given in The Encyclopedia Britanica.

As in CVD, only one face of a wafer is exposed for deposition in the tipping method of LPE. In the latter method, the molten flux is contained in a boat having an elevated, and thus shallow, end. The wafer rests on the bottom of the boat at the elevated end thereof. The bottom of the boat protects the adjacent face of the wafer from contact with the flux and thus, protects that face from deposition thereon.

The tipping method of LPE is known to have certain disadvantages. For one, the method is not isothermal. Isothermal or constant temperature deposition is preferred since uniformity in the composition of the deposited film is usually desired. Another disadvantage of the tipping method of LPE results from the fact that the volume of melted flux involved is usually relatively small. Thus, as the deposition proceeds, the composition of the involved melt changes. As with temperature variations this factor leads to nonuniformity in the composition of the deposited film.

The dipping method of LPE is the preferred method for producing high-quality deposited films. In the case of ferrimagnetic garnet films on nonmagnetic garnet substrates, for example, the films are regarded as having high quality when they have a uniform composition over substantially their entire area which may be relatively large. Low lossiness (or linewidth) for magnetostatic surface wave propagation is an important aspect of the quality of such films. Another advantage of the dipping method of LPE is that it may be used to grow complex film compositions having precisely controlled amounts of substituents or dopants therein by, for example, controlling the particular temperature at which deposition occurs and by stirring the flux to maintain its composition uniform.

When depositing a film on a single wafer by the dipping method of LPE, the wafer is ordinarily and preferably totally immersed in the molten flux. Therefore deposition can and does occur on each of the two faces of the wafer simultaneously.

Ways are known, however, to use the dipping method of LPE to grow a film on one side of a wafer only. Firstly, the surface of the wafer on which a film is to be deposited may be brought into contact with the surface of the flux bath while the opposite surface of the wafer is held out of such contact. Secondly, a wafer may be inserted into a holder together with a metal shield, usually of platinum. The shield is held in sealing contact with one surface of the wafer. The holder and shielded wafer may then be totally immersed in the flux. Neither one of these two approaches is satisfactory when uniformity in the deposited films is desired due to the high thermal gradients which are present at the surface of a molten flux bath or which are introduced deeper in the bath by the presence of thermally conducting metal shield. In addition, as will be seen below, these two approaches have a lower production rate than that of the subject invention.

In Bongianni, U.S. Pat. No. 3,864,647, there is disclosed a magnetostatic surface wave delay line. The preferred embodiment in Bongianni is a layered structure having two substantially identical layers of magnetic-wave-active material disposed on opposite sides of a magnetic-wave-inactive substrate. The layered structure is preferably fabricated by immersing the substrate in an LPE system in which both magnetic-wave-active layers grow simultaneously on the opposite sides of the substrate.

In order to operate the magnetostatic surface wave delay line disclosed in the above-referenced patent to Bongianni as a linearly dispersive or non-dispersive delay line, it is desired that the two layers of magnetic-wave-active material have different magnetic characteristics. Since these two layers have substantially identical compositions, the differing magnetic characteristics are obtained by placing the layered structure in a bias magnetic field having a substantial non-zero gradient substantially perpendicular to the deposited layers. A three-magnet configuration is disclosed for producing this special bias magnetic field.

Special magnet structures having a field with a gradient controlled to produce desired characteristics in a delay line are difficult to design and fabricate. It is preferable to use layered structures which can be operated as linearly dispersive or non-dispersive delay lines in a uniform bias magnetic field. This suggests that the individual magnetic-wave-active films or layers must be different from each other in some way.

Prior art techniques for fabricating such uniform bias magnetic field delay lines are discussed in Ganguly et al, Journal of Applied Physics, Vol. 45, No. 10, October 1974, pp. 4665-4667, "Magnetostatic Wave Propagation in Double Layers of Magnetically Anisotropic Slabs", and in Tsutsumi et al, IEEE Transactions on Microwave Theory and Techniques, Vol. MTT-24, No. 9, September 1976, pp. 591-597, "Effect of the Magnetic Perturbation on Magnetostatic Surface-Wave Propagation". These references are more fully discussed in concurrently filed U.S. patent application, Ser. No. 831,040 entitled "Improved Multiple Magnetic Layer Composite for Magnetostatic Surface Wave Propagation" filed by Wayne L. Bongianni on Sept. 6, 1977 and assigned to the assignee of the present application. A notice of Allowance dated Oct. 18, 1978, has been received for this concurrently filed application. The application of Bongianni describes a composite which may be fabricated by the method of the present application.

In Ganguly et al, physically distinct slabs of substantially identical ferrimagnetic materials are given a different crystallographic orientation relative to the bias magnetic field. In Tsutsumi et al, two physically distinct slabs of ferrite having different compositions are used. Neither Ganguly et al nor Tsutsumi et al discloses a monolithic multiple layer composite wherein two films of different materials and, consequently, different magnetic characteristics are epitaxially deposited on opposite sides of the same magnetic-wave-inactive substrate.

A layered composite comprising a substrate having two films of magnetic-wave-active material having magnetic characteristics different from each other, the two films being deposited on the opposite faces of the substrate, may be realized, for example, by causing the compositions or crystal structures of the two films to be different.

As is well known, the magnetic characteristics of a magnetic-wave-active material such as, for example, a ferrimagnetic garnet can be altered by substituting certain metallic ions for others in the garnet. The magnetic characteristics of yttrium iron garnet (YIG) are known to change when ions of other metals are introduced into the crystal lattice as substituents for the yttrium or iron. In the dipping method of LPE, the extent to which some substituents or dopants such as, for example, lead are incorporated into a deposited film can be controlled by varying the temperature of the molten flux. See, for example, copending U.S. Pat. Appln. by Glass et al, Ser. No. 931,713 (a continuation of application Ser. No. 792,159, filed Apr. 29, 1977, and now abandoned which, in turn, was a continuation of parent application, Ser. No. 687,428, filed May 17, 1976, and now abandoned), entitled "Minimization of the Ferromagnetic Resonance Linewidth in Yttrium Iron Garnet Films", filed Aug. 7, 1978 and assigned to the assignee of this application.

For other desired substituents such as gallium or lanthanum, for example, controlling the concentrations of salts of these metals introduced into the molten flux varies the extent of incorporation of the substituents into the lattice structure of the deposited film. See, for example, H. L. Glass, J. H. W. Liaw, and M. T. Elliot "Temperature Stabilization of Ferrimagnetic Resonance Field in Epitaxial YIG by Ga, La Substitution", Mat. Res. Bull. Vol. 12, No. 7, July 1977, P. 735, which discloses that combined substitution of gallium and lanthanum in YIG can be used to shift the field at which resonance occurs in YIG by an amount which is equivalent to a change in the resonance frequency of about one gigahertz for a given fixed bias field.

3. Prior Art Statement

Ferrimagnetic garnet films of, for example, YIG epitaxially deposited on nonmagnetic garnet substrates of, for example, gadolinium gallium garnet (GGG) are known for use in bubble memory devices. These devices are frequently fabricated using the dipping method of LPE. Bubble memory devices usually require a ferrimagnetic film on one face of the substrate only. In order to increase the productivity of dipping method LPE facilities, it has long been the custom to insert two wafer substrates into each set of clamps of a wafer holder for immersion and deposition thereon. A ferrimagnetic film is deposited only on the outer face of each such substrate while the inner faces seal each other from the molten flux.

SUMMARY OF THE INVENTION

The invention provides a method of fabricating a monolithic multiple layer composite comprising a substrate and two films, each film of a material different from the other, deposited on opposite faces of the substrate. The deposition is accomplished by the dipping method of LPE. Two wafer substrates, each having a first film of a first material deposited on a first face thereof are placed together in, for example, a clamp which holds the films on the first faces of the wafers in sealing contact with each other. The clamped wafers are then immersed in a molten flux for the deposition of a film of a second material on each of the second faces of the two wafers by the dipping method of LPE. The second material may be caused to be different from said first material by, for example, controllably varying the temperature or the composition of the molten flux, or both of these. This causes the composition of the second material to differ from that of the first material by the extent to which selected substituents or dopants are present. However, the two materials may also be of different types altogether. Where the composite being fabricated is for use in a linearly dispersive or non-dispersive magnetostatic surface wave delay line, the first and second materials are ferrites and their differences are controlled to provide a preselected difference in their magnetic characteristics. In this case, the first and second materials may each be independentally selected from any of the ferrites such as, for example, garnet ferrites, spinel ferrites, hexagonal ferrites, and orthoferrites.

DESCRIPTION OF THE PREFERRED EMBODIMENT

Figure 1:
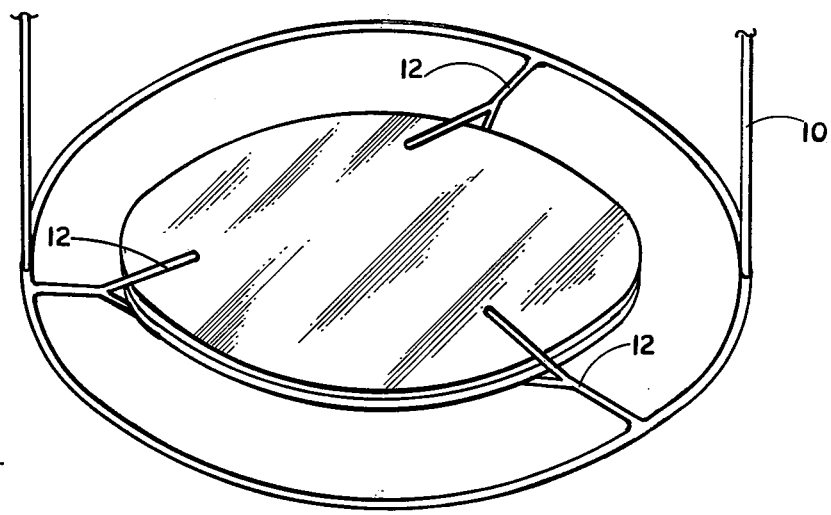
FIG. 1 is a perspective view of two wafer substrates held together in the clamps of a holder.

FIG. 1 shows a holder 10 of the type used in the dipping method of liquid phase epitaxy (LPE). The holder 10 includes three clamps 12 into which a pair of wafer substrates 14 and 16 are inserted.

Figure 2A:
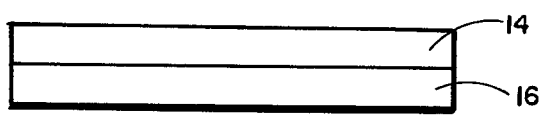
FIGS. 2A to 2F are sequential cross-sectional views of the two wafers shown in FIG. 1 as they are processed in accordance with the invention.

FIG. 2A shows the two wafer substrates 14 and 16 as they appear when held together in the clamps 12 of FIG. 1. The adjacent faces of wafers 14 and 16 are in sealing contact with each other.

Figure 2B:
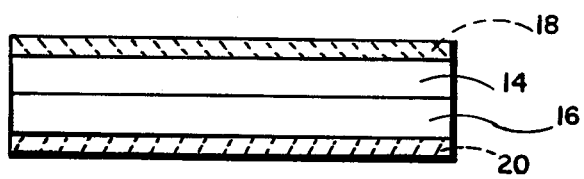

The wafer substrates 14 and 16, along with holder 10, are immersed in the molten flux of an LPE system under a set of controlled conditions such as preselected temperature of the flux, stirring rate, and concentrations of desired solutes in the solvent. A first pair of epitaxially deposited films 18 and 20 of a first material are deposited on the exposed faces of wafers 14 and 16 as represented in FIG. 2B. To this point, the method described is the same as that which has been used in the fabrication of bubble memories.

Figure 2C:
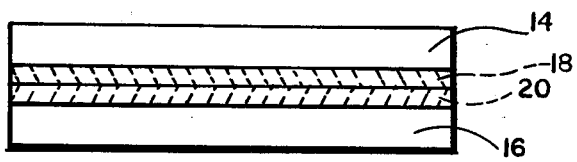

After forming the first pair of films 18 and 20, the wafers 14 and 16 are removed from the LPE system, separated, cleaned, and reinserted into holder 10 having clamps 12 as shown in FIG. 1. On this occasion, however, the wafers are reversed and the faces which previously faced outwardly are now held in sealing contact with each other. Consequently, the second faces of wafers 14 and 16 are now exposed for deposition as shown in FIG. 2C.

Figure 2D:
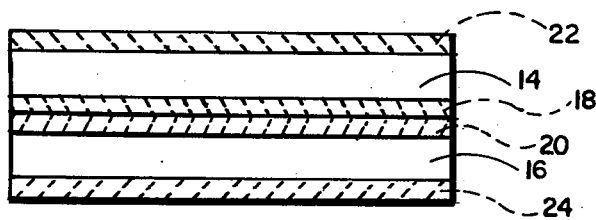

FIG. 2D shows the results of a second immersion of the wafers 14 and 16 into the molten flux of the LPE system. Conditions are changed for this second immersion. For example, the temperature of the flux may be controllably changed to a second predetermined value. The concentration of certain substituents in the flux may be controllably modified. Yet again, the molten flux may be a significantly different one which causes the deposition of an entirely different material from that of the first film. The composition of the second films thus deposited, films 22 and 24 on wafers 14 and 16, respectively, is thus caused to be different from first films 18 and 20.

Figure 2E:
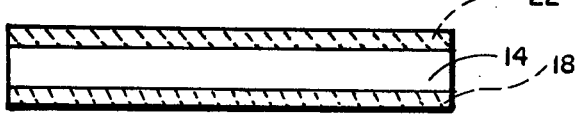
Figure 2F:
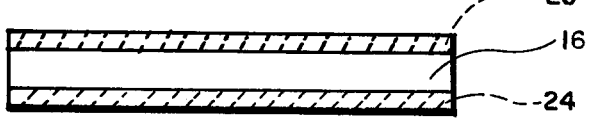

After the second films 22 and 24 are deposited by the dipping method of LPE as described above, wafers 14 and 16 are separated and cleaned as shown in FIGS. 2E and 2F respectively.

Where the present invention is used to fabricate elements for linearly dispersive or non-dispersive magnetostatic surface wave delay lines, the substrates are preferably of a magnetic-wave-inactive material such as, for example, GGG. The films are preferably of a magnetic-wave-active or ferrimagnetic material such as, for example, YIG having substituents such as gallium and lanthanum therein and dopants such as lead therein. In this case, the amount of substituent or dopant incorporated into the magnetic-wave-active material during the deposition is controlled to provide a preselected difference in the magnetic characteristics of the first and second films. However, any combination of different ferrite materials which can be deposited on the same substrate may be used for the magnetic-wave-active material. These materials include any garnet ferrite, spinel ferrite, hexagonal ferrite, and orthoferrite.

Having thus described a preferred embodiment of the invention, what is claimed is:

1. A method of fabricating a linearly dispersive or non-dispersive magnetostatic surface wave delay line, comprising:
   clamping first and second substrates together with first faces of said substrates directed away from each other and with second faces of said substrates urged against and into sealing relationship with each other;
   immersing said clamped first and second substrates into a first molten flux for the liquid phase epitaxial deposition by the dipping method of first films of a first ferrimagnetic material selected from the group consisting of garnet ferrite, spinel ferrite, hexagonal ferrite, and orthoferrite on said first faces of said first and second substrates;
   removing said first and second substrates from said first molten flux;
   clamping said first and second substrates together with said second faces of said substrates directed away from each other and with said first faces of said substrates having said first films thereon urged against and into sealing relationship with each other;
   immersing said clamped first and second substrates into a second molten flux for the liquid phase epitaxial deposition by the dipping method of second films of a second ferrimagnetic material selected from the group consisting of garnet ferrite, spinel ferrite, hexagonal ferrite, and orthoferrite on said second faces of said first and second substrates;
   controlling a condition of said second molten flux in a manner which causes said second ferrimagnetic material to have magnetic characteristics different from the magnetic characteristics of said first magnetic material; and
   using the monolithic multiple layer composite thus formed in said magnetostatic surface wave delay line.

2. The method recited in claim 1 wherein said first ferrimagnetic material is a first yttrium iron garnet.

3. The method recited in claim 2 wherein said second ferrimagnetic material is a second yttrium iron garnet.

4. The method recited in claim 3 wherein said substrates are of a nonmagnetic garnet.

5. The method recited in claim 4 wherein said nonmagnetic garnet is gadolinium gallium garnet.

6. The method recited in claim 1 comprising controlling the temperature of said first molten flux to cause said first films to have desired magnetic characteristics.

7. The method recited in claim 1 comprising controlling the composition of said second molten flux to cause said second films to have desired magnetic characteristics.

8. The method recited in claim 1 wherein said first and second molten fluxes are for the deposition of ferrites different from each other and selected from the group consisting of garnet ferrite, spinel ferrite, hexagonal ferrite, and orthoferrite.

* * * * *